United States Patent [19]

Moriyama et al.

[11] Patent Number: 4,798,470
[45] Date of Patent: Jan. 17, 1989

[54] PATTERN PRINTING METHOD AND APPARATUS

[75] Inventors: Shigeo Moriyama, Tama; Toshiei Kurosaki, Kodaira; Tsuneo Terasawa, Hachioji; Shinji Okazaki, Urawa; Yoshio Kawamura, Kokubunji, all of Japan

[73] Assignee: Hitachi, Ltd., Tokyo, Japan

[21] Appl. No.: 927,939

[22] Filed: Nov. 7, 1986

[30] Foreign Application Priority Data

Nov. 14, 1985 [JP] Japan ................................ 60-253686
Nov. 14, 1985 [JP] Japan ................................ 60-253687

[51] Int. Cl.[4] ............................................. G01B 11/00
[52] U.S. Cl. ................................................... 356/401
[58] Field of Search ............................. 356/400, 401

[56] References Cited

U.S. PATENT DOCUMENTS 4,326,805 3/1982 Feldman et al. .................... 356/401
4,614,433 9/1986 Feldman et al. .................... 356/401

Primary Examiner—Richard A. Rosenberger
Assistant Examiner—Crystal Cooper
Attorney, Agent, or Firm—Antonelli, Terry & Wands

[57] ABSTRACT

A pattern printing method includes a step of printing a pattern on a wafer on the basis of a target mark provided on the surface of the wafer which is opposite to the surface thereof on which the pattern is to be printed. Also disclosed is a pattern printing apparatus which comprises detecting means for detecting a target mark provided on the surface of a wafer which is opposite to the surface thereof on which a pattern is to be printed, and pattern printing means for printing the pattern on the pattern printing surface of the wafer on the basis of mark position data obtained by the detecting means.

9 Claims, 6 Drawing Sheets

PATTERN PRINTING METHOD AND APPARATUS

BACKGROUND OF THE INVENTION

The present invention relates to a method of printing a pattern on a wafer and an apparatus for carrying out such pattern printing method.

A typical semiconductor manufacturing process includes one step, generally known as lithography, in which a pattern is printed on a circuit pattern which has already been formed on a wafer in a previous step in such a manner that these two patterns are precisely aligned with each other. As apparatuses for such pattern printing, reduction projection aligners and X-ray aligners have heretofore been employed (see e.g., U.S. Pat. No. 4,380,395).

FIG. 1 is a schematic sectional view showing an essential part of a conventional pattern printing apparatus using X-rays as an exposure source. In the figure: the reference numeral 6 denotes a stage; 20, a drive unit for driving the stage 6; 24, a pattern detector: 1, a wafer placed on the stage 6; 2, a circuit pattern which has already been formed on the wafer 1 in a previous step; 3, a photoresist layer coated on the surface of the wafer 1; 21a, 21b, target marks provided on the surface of the wafer 1 which is printed with the pattern 2; 22, a photo mask; and 23a, 23b, opening patterns for alignment provided in the photo mask 22. An X-ray source is not shown in FIG. 1.

With such pattern printing apparatus, a pattern on the photo mask 22 is printed on the wafer 1 in the manner described below. The stage 6 is moved by the drive unit 20 while detecting the target marks 21a, 21b and the opening patterns 23a, 23b using the pattern detector 24 so that the target marks 21a and 21b are positioned at the respective centers of the opening patterns 23a and 23b, thereby precisely aligning the pattern 2 and the pattern on the photo mask 22 with each other. Then, the pattern detector 24 is moved out of an exposure range, and exposure is effected by an exposure unit (not shown).

The above-described conventional pattern printing method suffers, however, from the following problem. Since a multiplicity of layers are formed over the target marks 21a and 21b as the semiconductor manufacturing process proceeds, the configurations of the target marks 21a and 21b are deteriorated. In addition, since the target marks 21a and 21b must be observed through the photoresist layer 3 coated thereon, it is impossible to obtain a detection signal with excellent or high S/N ratio. Therefore, the degree of accuracy in alignment is lowered as the semiconductor manufacturing process proceeds. Further, the prior art involves the need to move the pattern detector 24 out of the exposure light path every time pattern printing is carried out.

SUMMARY OF THE INVENTION

In view of the above circumstances, it is a primary object of the present invention to provide a pattern printing method which enables a high degree of accuracy in alignment to be obtained at all times and which eliminates the need to move the pattern detector out of the exposure light path every time pattern printing is carried out, together with an apparatus for practicing the pattern printing method.

To this end, the present invention provides a pattern printing method comprising printing a pattern on a wafer on the basis of a target mark provided on the surface of the wafer which is opposite to the surface thereof on which the pattern is to be printed.

The present invention also provides a pattern printing apparatus comprising: detecting means for detecting a target mark provided on the surface of a wafer which is opposite to the surface thereof on which a pattern is to be printed; and pattern printing means for printing said pattern on the pattern printing surface of said wafer on the basis of mark position data obtained by the detecting means.

According to one preferred form of the present invention, a through-hole is provided in a wafer, and a detecting means is provided which simultaneously detects through the through-hole a target mark for alignment provided on the reverse surface of the wafer and at the peripheral portion of the through-hole and a target mark provided on an original pattern.

DETAILED DESCRIPTION OF THE PREFERRED EMBODIMENTS

Figure 1:
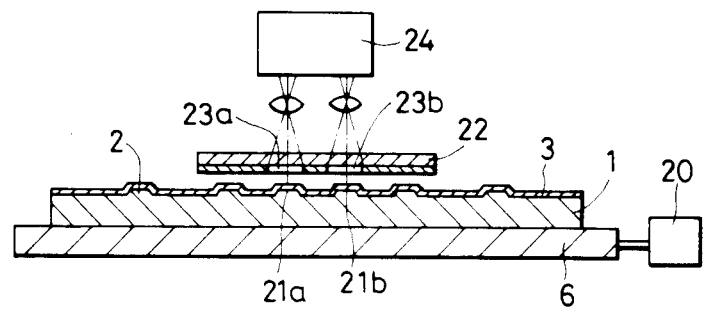
FIG. 1 is a schematic sectional view of one example of conventional pattern printing apparatus.
Figure 2:
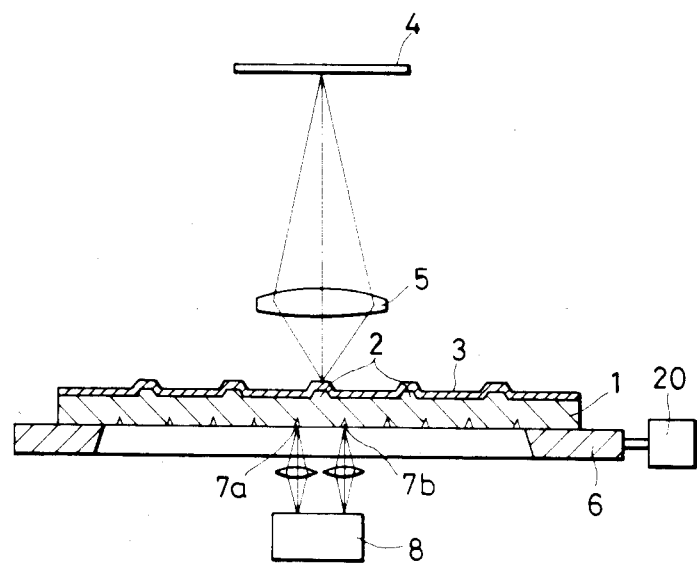
FIG. 2 is a schematic sectional view of an essential part of a reduction projection aligner in accordance with one embodiment of the present invention.

FIG. 2 is a schematic sectional view of an essential part of a reduction projection aligner in accordance with one embodiment of the present invention. In the figure: the reference numeral 4 denotes a reticle on which is drawn an enlarged view of a circuit pattern that is to be printed next; 5, a reduction lens; and 7a, 7b, target marks provided on the surface of a wafer 1 which is opposite to the surface thereof which is printed with a pattern 2, the target marks 7a, 7b being defined by recesses and provided at both ends, respectively, of the field of an exposure optical system including the reduction lens 5. An optical pattern detector 8 for detecting the target marks 7a, 7b is disposed on the side of the wafer 1 which remote from the surface thereof that is printed with the pattern 2, the pattern detector 8 including two optical systems. The distance between the respective axes of the two optical system of the pattern detector 8 is coincident with the distance between the target marks 7a and 7b. A drive unit 20 is controlled on the basis of mark position data obtained by the pattern detector 8.

To print a pattern using this reduction projection aligner, the positional relationship between the pattern detector 8 and the exposure optical system is set in advance so that, when the circuit pattern on the reticle 4 is printed by light exposure in a state wherein the two optical systems of the pattern detector 8 are in alignment with the respective centers of the target marks 7a and 7b, the circuit pattern on the reticle 4 is precisely aligned with the pattern 2 which has already been formed on the wafer 1 in a previous step. While the target marks 7a and 7b are being detected by the pattern detector 8, the drive unit 20 is controlled to move the stage 6 so that the two optical systems of the pattern detector 8 detect the respective centers of the target marks 7a and 7b. Thereafter, light exposure is effected to print the circuit pattern on the reticle 4 on the wafer 1.

Thus, according to the embodiment of the present invention, the target marks 7a and 7b are provided on the surface of the wafer 1 which is opposite to the surface thereof that is printed with the pattern 2. Consequently, no layer is formed over the target marks 7a and 7b, and no photoresist layer is coated thereon. There is therefore no fear of the configurations of the target marks 7a and 7b being deteriorated as the semiconductor manufacturing process proceeds. In addition, since the pattern detector 8 can be disposed on the side of the wafer 1 which is remote from the surface thereof that is printed with the pattern 2, it is unnecessary to move the pattern detector 8 out of the exposure light path every time pattern printing is carried out.

Figure 3:
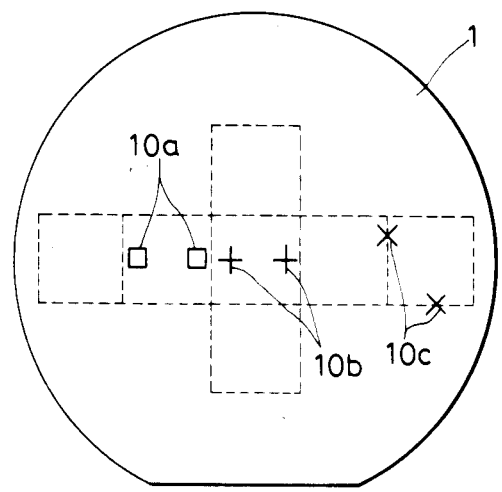
FIG. 3 is a plan view of a wafer employed in a pattern printing method according to the present invention.

It should be noted that the target marks 7a and 7b are formed prior to the formation of the first-level pattern 2. The target marks 7a and 7b may be formed by an etching technique such as contact exposure, projection exposure, etc., and an isotropic etching technique may also be employed. As to the target marks, various kinds of mark may be employed, e.g., square target marks 10a, +-shaped target marks 10b, and X-shaped target marks 10c, such as those shown in FIG. 3. Unlike the conventional arrangement, the arrangement according to the present invention has the advantage that positions where the target marks are arranged are not restricted by any circuit pattern, and the target marks may be provided at positions which correspond to scribe regions between chips as in the case of the target marks 10c.

Figure 4:
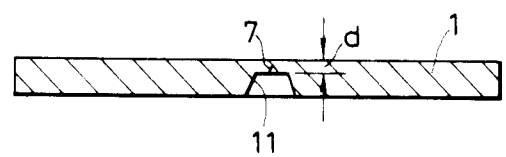
FIG. 4 is a schematic sectional view of another example of a wafer employed in the pattern printing method according to the present invention.

FIG. 4 is a schematic sectional view of a wafer employed in the pattern printing method according to the present invention. This wafer has a recess 11 provided in the surface thereof which is opposite to the surface thereof that is to be printed with the pattern 2, and target mark 7 is provided in the bottom surface of the recess 11. It is therefore possible to protect the target mark 7 from any mechanical contact and thereby to prevent the target mark 7 from becoming worn. In addition, since the distance d between the surface of the wafer 1 which is to be printed with the pattern 2 and the surface of the wafer 1 which is provided with the target mark 7 is reduced, it is possible to minimize the degree of misalignment due to possible inclination of the wafer 1.

Figure 5:
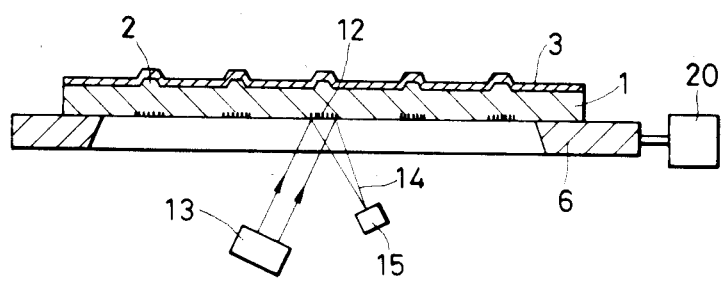
FIG. 5 is a schematic sectional view of an essential part of a pattern printing apparatus according to the present invention.
Figure 6:
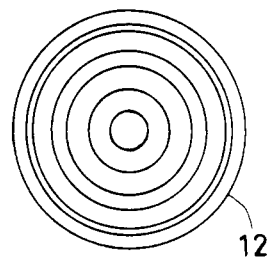
FIG. 6 shows Fresnel rings provided on the wafer illustrated in FIG. 5.

FIG. 5 is a schematical sectional view of an essential part of a pattern printing apparatus according to the present invention. In the figure, the reference numeral 12 denotes Fresnel rings provided on the surface of the wafer 1 which is opposite to the surface thereof that is printed with the pattern 2, the Fresnel rings 12 having a configuration such as that shown in FIG. 6. The reference numeral 13 denotes a laser beam generator which generates parallel laser beams. A position sensor 15 detects a spot image 14 produced when the Fresnel rings 12 are irradiated with the parallel laser beams. The drive unit 20 is controlled on the basis of mark position data obtained by the position sensor 15.

In this pattern printing apparatus, the position sensor 15 can be disposed at a position spaced apart from the wafer 1; therefore, there is no risk of the position sensor 15 and the stage 6 mechanically interfering with each other.

Figure 7:
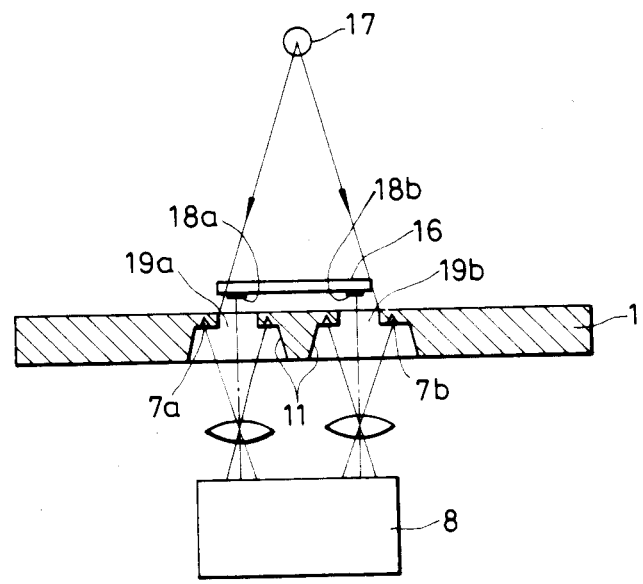
FIG. 7 is a schematic sectional view of an essential part of an X-ray aligner according to the present invention.

FIG. 7 is a schematic sectional view of an essential part of an X-ray aligner according to the present invention. In the figure: the reference numeral 17 denotes an X-ray source; 16, an X-ray mask disposed in close proximity with the surface of the wafer 1 which is printed with the pattern 2; 18a, 18b, alignment marks provided on the X-ray mask 16; and 19a, 19b, through-holes provided in the wafer 1 at positions respectively facing the alignment marks 18a, 18b. The target marks 7a and 7b are provided near the through-holes 19a and 19b, respectively.

In this X-ray aligner, the alignment marks 18a and 18b can be detected simultaneously with the target marks 7a and 7b. It is therefore unnecessary to set the positional relationship between the pattern detector 8 and the exposure optical system in advance. Since the pattern detector 8 is disposed on the side of the wafer 1 which is remote from the surface thereof that is printed with the pattern 2, it is possible for the pattern detector 8 to detect the target marks 7a, 7b and the alignment marks 18a, 18b without interfering with the X-rays from the X-ray source 17 during exposure, which means that it is possible to control the drive unit 20 at all times during exposure. In addition, since the target marks 7a and 7b are provided in the respective bottom surfaces of the recesses 11, the respective distances between the target marks 7a, 7b and the alignment marks 18a, 18b are exceedingly small, so that it is possible to observe simultaneously the target marks 7a, 7b and the alignment marks 18a, 18b even when each of the optical systems constituting the pattern detector 8 has a relatively small focal depth.

Although in the above-described embodiments the optical pattern detector 8 is employed, a pattern detector employing an electron beam may also be employed. In such case, it is possible to further increase the degree of accuracy in alignment.

Figure 8:
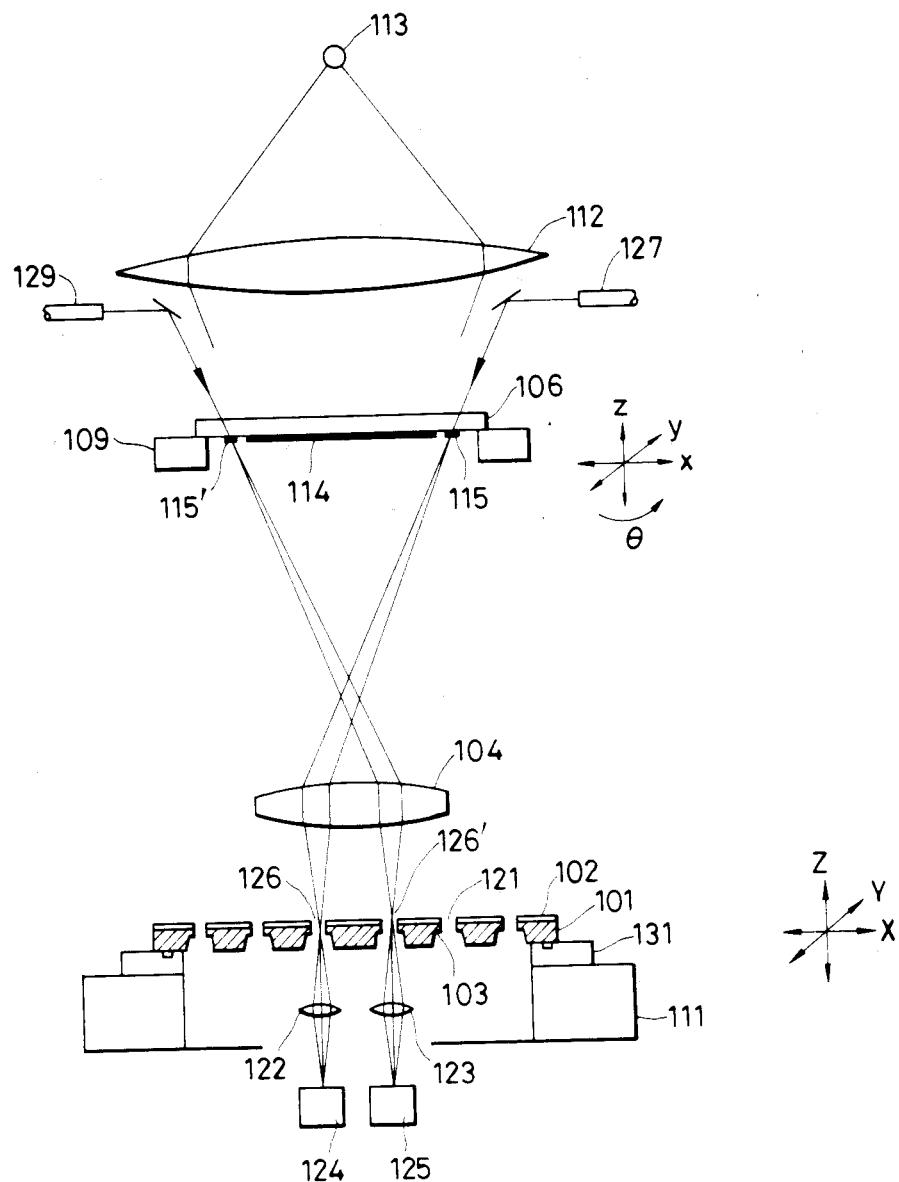
FIG. 8 shows the arrangement of another embodiment of the aligner according to the present invention.

FIG. 8 shows a further embodiment of the present invention, in which the present invention is applied to a reduction projection aligner. The aligner comprises an illuminating optical system consisting of a light source 113 and a lens 112 for printing an original pattern 114 by light exposure, a reticle 106 and a mechanism 109 for finely adjusting the reticle 106, a projecting lens 104, an XY stage 111 on which a wafer 101 coated with a photosensitive material 102 is fixed by a fixing plate 131, and mark detectors 124, 125 disposed on the reverse side of the wafer 101. The reference numerals 127 and 129 denote illuminators for illuminating target marks 115 and 115', respectively. The wafer 101 is provided with a plurality of minute through-holes 121 which are located at positions where target marks 103 for alignment are provided, respectively, two or three through-holes 121 being provided for each exposure region at the peripheral portion thereof. On the reverse side of the wafer 101, the mark detectors 124 and 125 are rigidly secured to the whole of the apparatus. The wafer 1 is movable in the directions of X, Y and Z. The reticle 106 is finely movable in the four directions, that is, x, y, $\theta$ and z, by the operation of the finely adjusting mechanism 109.

Pattern alignment in the reduction projection aligner arranged as described above will first be explained below.

Figure 9:
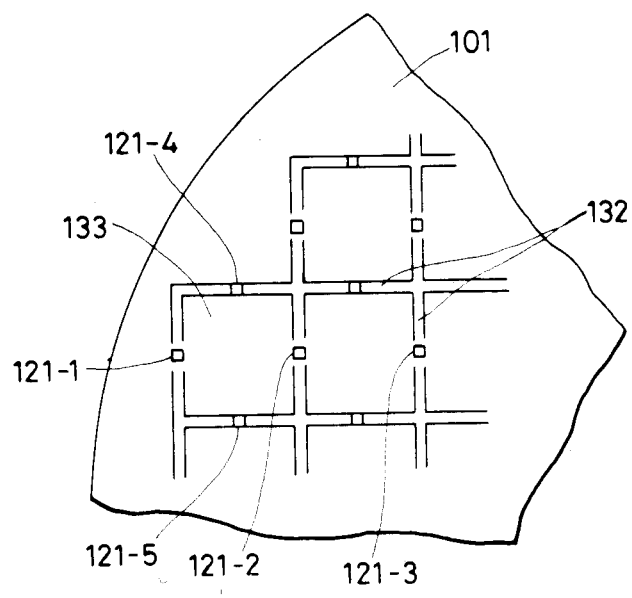
FIG. 9 shows the external appearance of a part of a wafer employed in the embodiment illustrated in FIG. 8.
Figure 10:
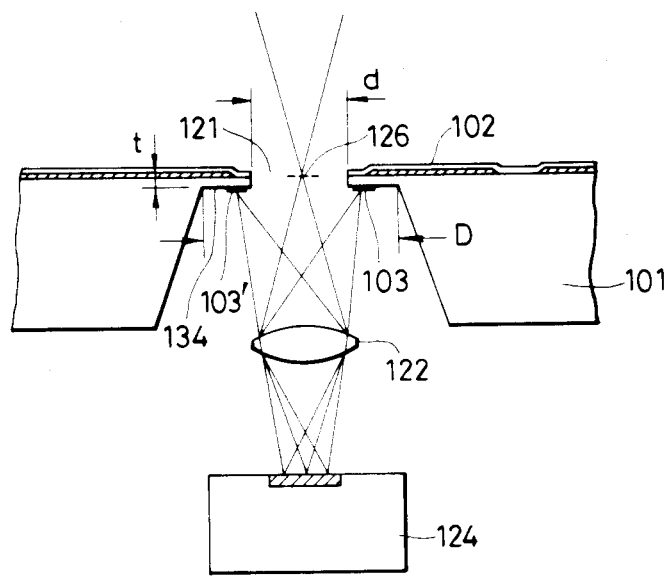
FIG. 10 shows the wafer illustrated in FIG. 9 and a mark detecting section.
Figure 11:
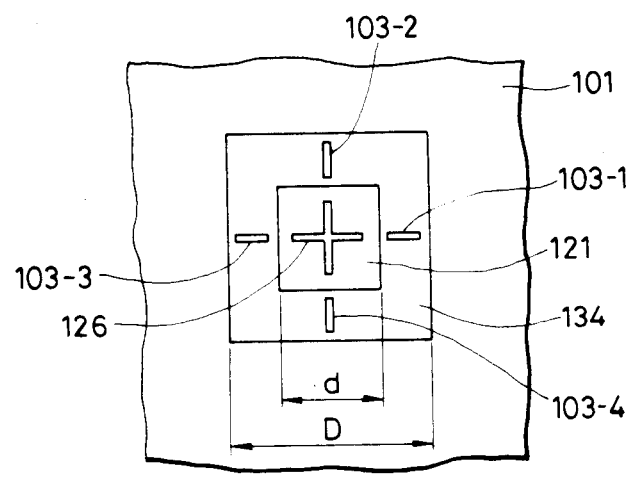
FIG. 11 shows alignment marks.

FIG. 9 shows the external appearance of a part of the wafer 101 which is to be subjected to pattern alignment. Although in the arrangement shown in FIG. 9 through-holes 121-1, 121-2, etc. are provided at the peripheral portion 132 of a circuit pattern 133 in each exposure region on the wafer 101, the peripheral portion 132 may be a scribe area. The through-holes 121-1, 121-2, etc. are formed after the first exposure and development processing has been completed. FIG. 10 is a fragmentary sectional view showing the through-holes 121-1, 121-2, etc. provided in the wafer 101. A hole is formed around each through-hole 121 from the reverse surface of the wafer 101 with a portion thereof left having a thickness t, the hole having a dimension D which is, for example, about twice the dimension d of the through-hole 121. Target marks 103 and 103' for alignment are formed on the peripheral portion 134 of the through-hole 121. Formation of the target marks 103 and 103' at the above-described positions advantageously makes it difficult for the target marks 103 and 103' to be affected during the manufacturing process. In alignment, the relative positions of the target mark 115 on the reticle 106 and the target marks 103, 103' on the wafer 101 are first obtained. The projected image 126 of the target mark 115 is formed on the same plane of the through-hole 121 as the surface of the wafer 101. The relationship between the target mark 115 and the target mark 103 on the wafer 101 is shown in FIG. 11. However, the illustrated marks are only examples, and various mark configurations may be employed in addition to them. The projected image 126 of the target mark 115 and the target mark 103 are detected by the mark detectors 124, 125 through the mark detecting optical systems 122, 123, respectively. The mark detectors 124 and 125 effect signal processing in a two-dimentional manner to calculate the relative positions of the target marks 115 and 103. The above-described processing is executed at the through-holes 121-1 and 121-2, and XY coordinates are calculated, whereby it is possible to obtain the positional relationship $\Delta X$, $\Delta Y$ and $\Delta Z$ between the circuit pattern 133 on the wafer 101 and a circuit pattern which is to be printed thereon. The reticle 106 and the wafer 101 are finely moved relative to each other so that $\Delta X$, $\Delta Y$ and $\Delta Z$ are zero, thus effecting alignment. When the magnification of the projecting lens 104 is changed due to a change in the atmospheric pressure, the distance between the two target marks 126 and 126' and the distance between the target marks 103 and 103' may be different from each other. In such case, the reticle 106 is finely moved in the direction of the optical axis (the direction of Z) so that the above-described distances are equal to each other, thus making compensation for the changed magnification.

It should be noted that the thickness t of the portion of the wafer 1 on which the target mark 103 is formed is preferably set within the focal depth of the mark detecting optical system. However, when it is necessary to increase the thickness t, it is possible to cope with such requirement by employing a double-focus optical system as the mark detecting optical system.

Figure 12:
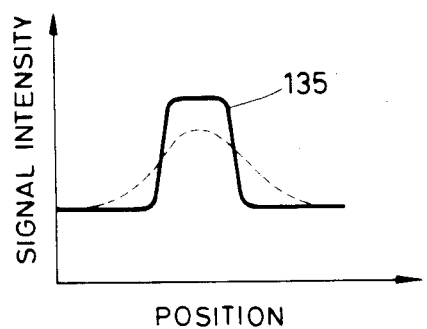
FIG. 12 shows a detection signal obtained by a mark detector.

The following is a description of focusing which is needed when printing by light exposure is carried out, and the method of marking compensation for the amount of possible inclination of an exposure region. Target marks provided at the through-holes, e.g., 121-1, 121-2 and 121-4, around the exposure region 133 are detected by the mark detector 124. A focused position is found by detecting a position at which the edge of a signal obtained by the detection rises steeply as shown by the solid line 135 in FIG. 12. Focusing and correction for the amount of inclination are effected by finely moving the stage 111 on which the wafer 101 is secured in the direction of the optical axis and the direction of inclination so that the edge of the mark signal rises steeply as shown in FIG. 12.

As has been described above, in the pattern printing method and the apparatus therefor according to the present invention, there is no fear of target marks being deteriorated. It is therefore possible to effect alignment with high precision at all times. In addition, since it is possible to dispose a detecting means for detecting the target marks on the side of a wafer which is remote from the surface thereof that is printed with a pattern, it is unnecessary to move the detecting means out of the exposure range every time pattern printing is carried out. Thus, the present invention offers great advantages.

What is claimed is:

1. A pattern printing method comprising the steps of:
   providing a wafer adapted to have a pattern printed on one side and having a target mark provided on a surface that is on the other side opposite said one side;
   detecting said target mark to provide data concerning the precise location of said wafer; and
   adjusting the position of the wafer relative to the position of an apparatus for printing said pattern in accordance with the data resulting from detecting said target mark.

2. A pattern printing method according to claim 1, wherein said target mark is defined by a recess formed in the surface of said wafer.

3. A pattern printing method according to claim 1, wherein said target mark is defined by Fresnel rings.

4. A pattern printing method according to claim 1, wherein said target mark is provided on the bottom surface of a recess provided in said wafer.

5. A pattern printing method according to claim 1, wherein said target mark is provided in the vicinity of a through-hole provided in said wafer.

6. A pattern printing apparatus comprising:
   a wafer having a first surface upon which a pattern is to be printed and a second surface opposite said first surface including a target mark;
   means for detecting said target mark position;
   means for printing said pattern on said first surface; and
   means responsive to an output from said target mark position detecting means for controlling the position of said printing means relative to the position of said wafer.

7. A pattern printing apparatus according to claim 6, wherein said detecting means has a pattern detector of the type which makes use of rays reflected from said target mark.

8. A pattern printing apparatus according to claim 6, wherein said detecting means has a pattern detector which makes use of an electron beam.

9. A pattern printing apparatus in which an original pattern is printed by light exposure on a substrate coated with a photosensitive material, comprising: a plurality of minute through-holes respectively provided in specific regions on said substrate; an alignment mark provided on the reverse surface of said substrate and at the peripheral portion of each of said through-holes; a target mark provided on said original pattern; and a mark detector provided on the reverse side of said substrate for simultaneously detecting said alignment mark and said target mark or a projected image of said target mark through said through-hole.

* * * * *